United States Patent
Gupta et al.

(10) Patent No.: US 12,526,947 B2
(45) Date of Patent: Jan. 13, 2026

(54) OUTDOOR NETWORKING EQUIPMENT ENCLOSURE UTILIZING INTERNAL OPEN FRAME POWER SUPPLY FOR OPTIMUM THERMAL MANAGEMENT AND CABLE MINIMIZATION

(71) Applicant: Ciena Corporation, Hanover, MD (US)

(72) Inventors: Chander Prakash Gupta, Gurugram (IN); Sachin Singla, Gurugram (IN); Suyash Agrawal, Gurugram (IN); Ranjeet Chaurasiya, Gurugram (IN); Karan Goel, Gurugram (IN)

(73) Assignee: Ciena Corporation, Hanover, MD (US)

( * ) Notice: Subject to any disclaimer, the term of this patent is extended or adjusted under 35 U.S.C. 154(b) by 434 days.

(21) Appl. No.: 18/133,560

(22) Filed: Apr. 12, 2023

(65) Prior Publication Data
US 2024/0292558 A1 Aug. 29, 2024

(30) Foreign Application Priority Data
Feb. 23, 2023 (IN) .............................. 202311012268

(51) Int. Cl.
*H05K 7/14* (2006.01)
*H05K 5/03* (2006.01)
*H05K 7/20* (2006.01)

(52) U.S. Cl.
CPC ............. *H05K 7/1432* (2013.01); *H05K 5/03* (2013.01); *H05K 7/1407* (2013.01); *H05K 7/1492* (2013.01); *H05K 7/20409* (2013.01); *H05K 7/209* (2013.01)

(58) Field of Classification Search
CPC ...... H05K 7/1432; H05K 7/03; H05K 7/1492; H05K 7/1407; H05K 7/20409; H05K 7/209
See application file for complete search history.

(56) References Cited

U.S. PATENT DOCUMENTS

| 10,353,163 | B1* | 7/2019 | Hanks ................... G02B 6/4448 |
|---|---|---|---|
| 2013/0083488 | A1* | 4/2013 | Watanabe ........... H01L 23/4006 |
| | | | 257/E23.083 |
| 2014/0268086 | A1* | 9/2014 | Lu ........................ G03F 7/70191 |
| | | | 355/71 |
| 2019/0069438 | A1* | 2/2019 | Guo ..................... H05K 1/0203 |
| 2022/0209513 | A1* | 6/2022 | Jung .................. H05K 7/20472 |
| 2023/0345614 | A1* | 10/2023 | Lau ......................... H05K 3/303 |

* cited by examiner

*Primary Examiner* — Allen L Parker
*Assistant Examiner* — Peter Krim
(74) *Attorney, Agent, or Firm* — Clements Bernard Walker; Christopher L. Bernard

(57) ABSTRACT

A networking equipment enclosure assembly, including: a base chassis; a lid coupled to the base chassis; a printed circuit board disposed within the base chassis; and a power supply unit disposed between the printed circuit board and the lid, wherein the power supply unit is spaced apart from and biased away from the printed circuit board and towards the lid via a spring mechanism coupled between the printed circuit board and the power supply unit. The networking equipment enclosure assembly also includes a heat spreader plate disposed between the power supply unit and the lid and coupled to the power supply unit. The power supply unit is biased towards the lid via the spring mechanism coupled between the printed circuit board and the power supply unit such that the heat spreader plate is pressed into thermal contact with the lid.

20 Claims, 10 Drawing Sheets

OUTDOOR NETWORKING EQUIPMENT ENCLOSURE UTILIZING INTERNAL OPEN FRAME POWER SUPPLY FOR OPTIMUM THERMAL MANAGEMENT AND CABLE MINIMIZATION

CROSS-REFERENCE TO RELATED APPLICATION

The present disclosure claims the benefit of priority of co-pending Indian Patent Application No. 202311012268, filed on Feb. 23, 2023, and entitled "Outdoor networking equipment enclosure utilizing internal open frame power supply for optimum thermal management and cable minimization," the contents of which are incorporated in full by reference herein.

FIELD OF THE DISCLOSURE

The present disclosure relates generally to optical networking equipment. More particularly, the present disclosure relates to an outdoor networking equipment enclosure utilizing an internal open frame power supply for optimum thermal management and cable minimization.

BACKGROUND OF THE DISCLOSURE

Outdoor telecommunications products and networking equipment typically include power supply units (PSUs) that must maintain an optimum temperature to ensure product functionality and reliability. Such products need to operate in an outdoor ambient temperature range of −40° C. to +46° C., with solar loads, and −40° C. to +60° C., without solar loads, for example. To meet these temperature requirements, conventionally, open frame PSUs are mounted either as field replaceable units (FRUs) outside the base chassis and lid (e.g., typically outside the lid) of the networking equipment enclosure or inside and coupled to the lid of the networking equipment enclosure. External mounting brings ingress protection design into consideration, as enclosure openings are required for cables and/or the like that must be sealed with gaskets and/or the like. Both external and internal (i.e., lid) mounting bring cable length and routing into consideration, as longer cables are prone to physical damage (e.g., via cable pinching), especially when they span moveable and/or separable components (i.e., the base chassis and the lid), are likely to experience voltage drop and cause/receive greater electromagnetic interference (EMI) with/from other electronic components, and must be routed with various cable management systems, taking up valuable space when small form factor is desirable. As a result, design, production, and servicing are all more complicated. Both external and internal (i.e., lid) mounting also require the use of a thermal interface material, such as a gap pad or thermal paste, to couple the PSU to the lid and/or base chassis that needs to be replaced or reapplied every time a PSU is removed and replaced.

Thus, it is desirable that improved PSU installations and thermal stabilization methodologies be provided. The present background is provided as environmental context only. It will be readily apparent that the concepts and principles of the present disclosure may be applied in other applications in other environmental contexts equally.

BRIEF SUMMARY OF THE DISCLOSURE

The present disclosure provides a hardened outdoor (or indoor) networking equipment enclosure in which the PSU is mounted inside the base chassis and lid of the enclosure over a printed circuit board (PCB) including the various electronic components of the product. A spring mechanism is used to bias the PSU against the closed lid of the enclosure and a heat spreader plate is disposed between the PSU and the lid to enhance the thermal interface between the PSU and the lid, which is a pressure/contact interface. An insulation plate is disposed between the PCB and the PSU to minimize heat transfer between the PSU and the PCB and thermally isolate the PSU. Heat transfer from the lid to the base chassis and the surrounding environment is unaffected.

This internal arrangement eliminates or minimizes enclosure openings that are required for cables and/or the like that must be sealed with gaskets and/or the like. This internal arrangement also eliminates longer cables that are prone to physical damage (e.g., via cable pinching), are likely to experience voltage drop and cause/receive greater EMI with/from other electronic components, and must be routed with various cable management systems, taking up valuable space when small form factor is desirable. No cables span moveable and/or separable components (i.e., the base chassis and the lid). No thermal interface material, such as a gap pad or thermal paste, needs to be replaced or reapplied every time the PSU is removed and replaced to couple the PSU to the lid, as a dry thermal pressure/contact interface is provided to dissipate PSU heat to ambient. The stacked PCB/PSU arrangement utilized itself promotes a small form factor as compared to a side-by-side arrangement.

In one embodiment, the present disclosure provides a networking equipment enclosure assembly, including: a base chassis; a lid coupled to the base chassis; a printed circuit board disposed within the base chassis; and a power supply unit disposed between the printed circuit board and the lid, wherein the power supply unit is spaced apart from and biased away from the printed circuit board and towards the lid via a spring mechanism coupled between the printed circuit board and the power supply unit. The networking equipment enclosure assembly also includes a heat spreader plate disposed between the power supply unit and the lid and coupled to the power supply unit. The power supply unit is biased towards the lid via the spring mechanism coupled between the printed circuit board and the power supply unit such that the heat spreader plate is pressed into thermal contact with the lid. The networking equipment enclosure assembly further includes one or more thermally conductive gap pads disposed between the power supply unit and the heat spreader plate. The networking equipment enclosure assembly still further includes an insulation plate disposed adjacent to the printed circuit board between the printed circuit board and the power supply unit. The spring mechanism includes one or more resilient members or springs disposed between the printed circuit board and the power supply unit. Each of the one or more resilient members or springs is disposed about a screw coupled to the printed circuit board through the power supply unit. The screw constrains lateral and traverse translation of the power supply unit with respect to the printed circuit board, but allows a degree of longitudinal motion of the power supply unit with respect to the printed circuit board between the printed circuit board and the lid.

In another embodiment, the present disclosure provides a networking equipment assembly, including: a printed circuit board; and a power supply unit disposed adjacent to the printed circuit board, wherein the power supply unit is spaced apart from and biased away from the printed circuit board via a spring mechanism coupled between the printed circuit board and the power supply unit. The networking equipment assembly also includes: a base chassis; and a lid coupled to the base chassis; wherein the printed circuit board is disposed within the base chassis; and wherein the power supply unit is disposed between the printed circuit board and the lid, wherein the power supply unit is spaced apart from and biased away from the printed circuit board and towards the lid via the spring mechanism coupled between the printed circuit board and the power supply unit. The networking equipment assembly further includes a heat spreader plate disposed between the power supply unit and the lid and coupled to the power supply unit. The power supply unit is biased towards the lid via the spring mechanism coupled between the printed circuit board and the power supply unit such that the heat spreader plate is pressed into thermal contact with the lid. The networking equipment assembly still further includes one or more thermally conductive gap pads disposed between the power supply unit and the heat spreader plate. The networking equipment assembly still further includes an insulation plate disposed adjacent to the printed circuit board between the printed circuit board and the power supply unit. The spring mechanism includes one or more resilient members or springs disposed between the printed circuit board and the power supply unit. Each of the one or more resilient members or springs is disposed about a screw coupled to the printed circuit board through the power supply unit. The screw constrains lateral and traverse translation of the power supply unit with respect to the printed circuit board, but allows a degree of longitudinal motion of the power supply unit with respect to the printed circuit board between the printed circuit board and the lid.

In a further embodiment, the present disclosure provides a networking equipment thermal management method, including: given a base chassis and a lid coupled to the base chassis, providing a printed circuit board within the base chassis; providing a power supply unit between the printed circuit board and the lid, wherein the power supply unit is spaced apart from the printed circuit board; and biasing the power supply unit away from the printed circuit board and towards the lid via a spring mechanism coupled between the printed circuit board and the power supply unit. The networking equipment thermal management method further including: providing a heat spreader plate between the power supply unit and the lid and coupled to the power supply unit; and biasing the power supply unit towards the lid via the spring mechanism coupled between the printed circuit board and the power supply unit such that the heat spreader plate is pressed into thermal contact with the lid. The networking equipment thermal management method further including one or more of: providing one or more thermally conductive gap pads between the power supply unit and the heat spreader plate; and providing an insulation plate adjacent to the printed circuit board between the printed circuit board and the power supply unit.

BRIEF DESCRIPTION OF THE DRAWINGS

The present disclosure is illustrated and described herein with reference to the various drawings, in which like reference numbers are used to denote like assembly components/process steps, as appropriate, and in which.

DETAILED DESCRIPTION OF THE DISCLOSURE

Again, the present disclosure provides a hardened outdoor (or indoor) networking equipment enclosure in which the PSU is mounted inside the base chassis and lid of the enclosure over a printed circuit board (PCB) including the various electronic components of the product. A spring mechanism is used to bias the PSU against the closed lid of the enclosure and a heat spreader plate is disposed between the PSU and the lid to enhance the thermal interface between the PSU and the lid, which is a pressure/contact interface. An insulation plate is disposed between the PCB and the PSU to minimize heat transfer between the PSU and the PCB and thermally isolate the PSU. Heat transfer from the lid to the base chassis and the surrounding environment is unaffected.

This internal arrangement eliminates or minimizes enclosure openings that are required for cables and/or the like that must be sealed with gaskets and/or the like. This internal arrangement also eliminates longer cables that are prone to physical damage (e.g., via cable pinching), are likely to experience voltage drop and cause/receive greater EMI with/from other electronic components, and must be routed with various cable management systems, taking up valuable space when small form factor is desirable. No cables span moveable and/or separable components (i.e., the base chassis and the lid). No thermal interface material, such as a gap pad or thermal paste, needs to be replaced or reapplied every time the PSU is removed and replaced to couple the PSU to the lid, as a dry thermal pressure/contact interface is provided to dissipate PSU heat to ambient. The stacked PCB/PSU arrangement utilized itself promotes a small form factor as compared to a side-by-side arrangement.

Figure 1:
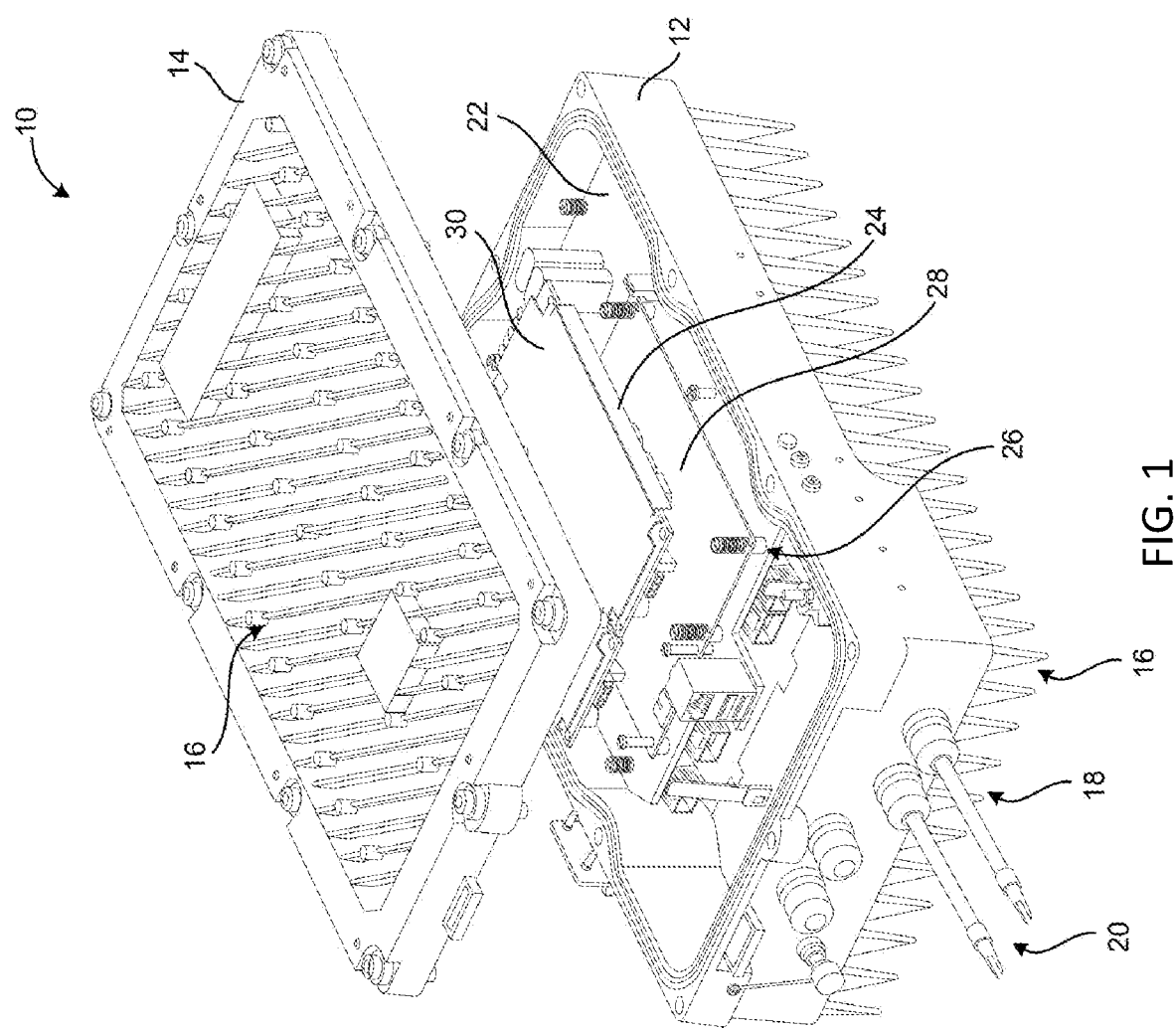
FIG. 1 is a partially exploded perspective view of one embodiment of the networking equipment enclosure of the present disclosure.

FIG. 1 is a partially exploded perspective view of one embodiment of the networking equipment enclosure 10 of the present disclosure. The enclosure 10 includes a base chassis 12 and a lid 14 that may be screwed, latched, and/or hinged coupled to the base chassis to form a sealed housing. The lid 14 may be a top lid, a bottom cover, or a side cover that may be separable from or pivotable with respect to the base chassis 12. In the embodiment illustrated, the lid 14 is a top lid that is separable from and screwed to the base chassis 12. Both the base chassis 12 and the lid 14 are adapted to dissipate heat from the components disposed within the enclosure 10 to ambient by convection. Accordingly, the base chassis 12 and/or lid 14 may include any number and arrangement of external cooling ribs, fins, pins, and/or other structures 16 that increase the external surface area available for convection. The base chassis 12 and the lid 14 may each be manufactured from die-casted aluminum or the like, providing the desired structural integrity and conduction properties. Any number of ports 18 are provided through the base chassis 12 and/or lid 14 to allow for the routing of cables/contacts 20 to the components disposed within the enclosure 10.

The electronic components housed within the enclosure 10 are disposed on a PCB 22 secured within the enclosure 10. A PSU 24 is disposed adjacent to (e.g., above in the embodiment illustrated) the PCB 22 and biased towards the lid 14 by a plurality of spring mechanisms 26, described in greater detail below. An insulation plate 28 is disposed between the PCB 22 and the PSU 24 to minimize heat transfer between the PSU 24 and the PCB 22 and thermally isolate the PSU 24. A heat spreader plate 30 is disposed between the PSU 24 and the lid 14 to enhance the thermal interface between the PSU 24 and the lid 14, which is a pressure/contact interface due to the presence of the spring mechanisms 26. The insulation plate 28 may be, for example, an injection molded plastic plate designed to meet IEC-62368 safety standard isolation requirements. The heat spreader plate 30 may be, for example, a micro-thermal insulation material (TIM) plate manufactured from a metal, a metal alloy, a structured carbon, and/or various other thermally conductive materials.

Figure 2:
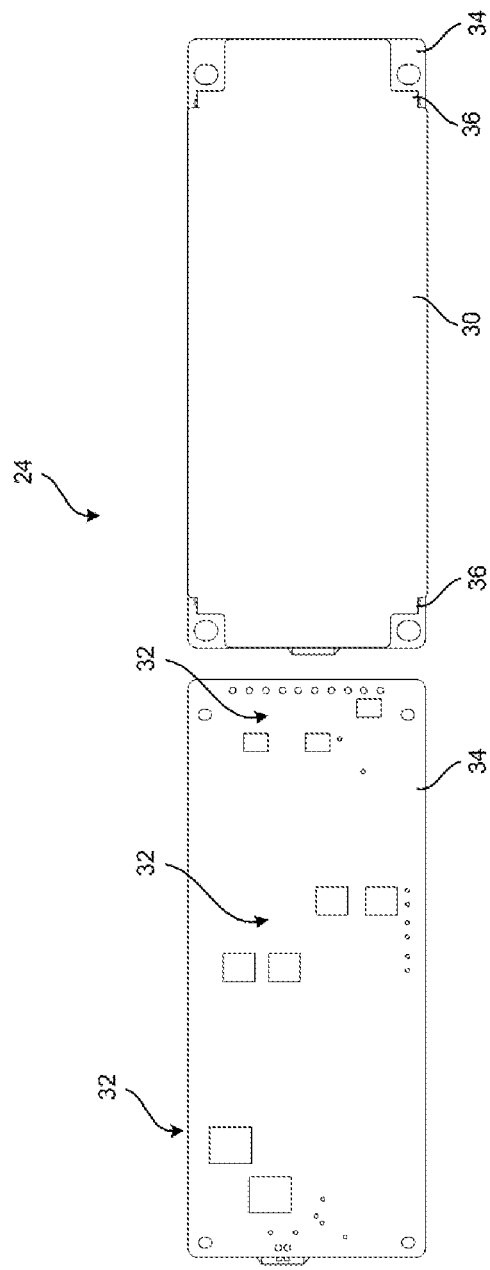
FIG. 2 is a series of planar views of the PSU and heat spreader plate of the enclosure of FIG. 1.

FIG. 2 is a series of planar views of the PSU 24 and heat spreader plate 30 of the enclosure 10 of FIG. 1. The major heat dissipating components 32 of the PSU 24, including bridge rectifiers, metal-oxide-semiconductor field-effect transistors (MOSFETs), etc., are disposed on a first side of the PSU PCB 34, and other components that are not critical from a heat dissipation perspective are disposed on a second side of the PSU PCB 34. The heat spreader plate 30 is soldered adjacent to the first side of the PSU PCB 34 at a plurality of attachment tabs 36 of the heat spreader plate, for example. The attachment tabs 36 form a gap between the heat spreader plate 30 and the PSU PCB 34 in which the heat dissipating components 32 of the PSU 24 are disposed.

Figure 3:
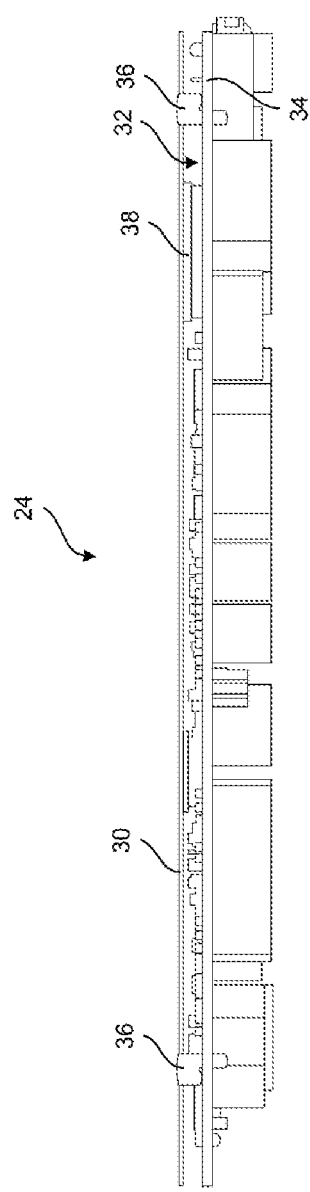
FIG. 3 is a side planar of the PSU and heat spreader plate of the enclosure of FIG. 1.

FIG. 3 is a side planar of the PSU 24 and heat spreader plate 30 of the enclosure 10 of FIG. 1. Again, the major heat dissipating components 32 of the PSU 24, including bridge rectifiers, MOSFETs, etc., are disposed on the first side of the PSU PCB 34, and other components that are not critical from a heat dissipation perspective are disposed on the second side of the PSU PCB 34. The heat spreader plate 30 is soldered adjacent to the first side of the PSU PCB 34 at the plurality of attachment tabs 36 of the heat spreader plate 30, for example. The attachment tabs 36 form a gap between the heat spreader plate 30 and the PSU PCB 34 in which the heat dissipating components 32 of the PSU 24 are disposed. These components 32 are thermally coupled to the heat spreader plate 30 via one or more thermally conductive gap pads 38 disposed between the components 32 and the heat spreader plate 30.

Figure 4:
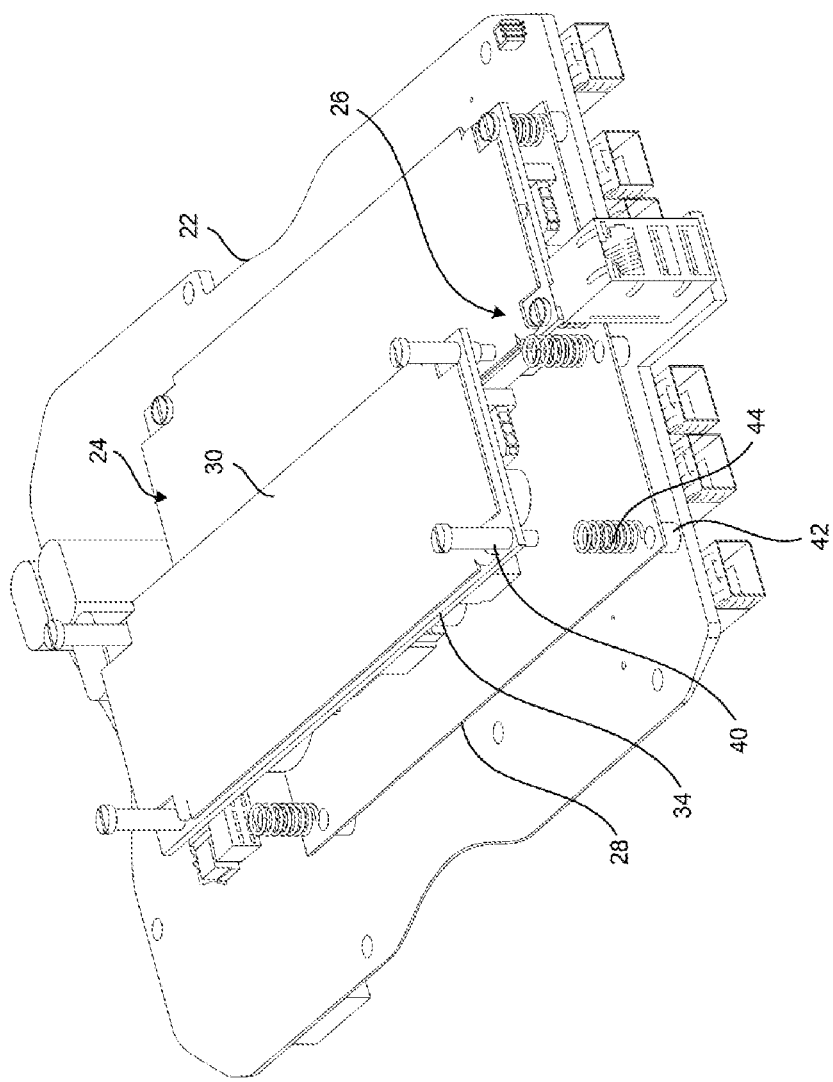
FIG. 4 is a perspective view of the PCB, insulation plate, PSUs, and spring mechanisms of the enclosure of FIG. 1.

FIG. 4 is a perspective view of the PCB 22, insulation plate 28, PSUs 24, and spring mechanisms 26 of the enclosure 10 of FIG. 1. It should be noted that the enclosure 10 may include a single PSU 24 and heat spreader plate 30 disposed adjacent to (e.g., above) the PCB 22, or multiple PSUs 24 and heat spreader plates 30 disposed adjacent to (e.g., above) the PCB 22 in a side-by-side configuration (as illustrated). The components of the PSU(s) 24 are isolated from the components disposed on the PCB 22 via the one or more insulation plates 28, providing thermal isolation between the components of the PSU(s) 24 and the components disposed on the PCB 22. Each PSU 24 and associated heat spreader plate 30 is biased away from the PCB 22, and towards and into the lid 14 of the enclosure 10 by the spring mechanisms 26 disposed in each corner of the PSU PCB 34 in the embodiment illustrated. Each spring mechanism 26 includes a screw 40 having a head portion, a body portion, a shoulder, and a tip portion. The tip portion of the screw 40 is secured into a solder nut 42 coupled to the PCB 22, with the body portion of the screw 40 being disposed through the PSU PCB 34 and the head portion of the screw 40 retaining the PSU PCB 34. The shoulder of the screw 40 may be used to secure the associated portion of the insulation plate 28 adjacent to (e.g., above) the PCB 22. A resilient member or spring 44 (e.g., a coil spring, a resilient collar, or a spring tab) is disposed concentrically about the body portion of the screw 40 between the PCB 22 and/or insulation plate 28 and the PSU PSB 34. This arrangement laterally restrains the PSU 24 and heat spreader plate 30 with respect to the PCB 22 (and, optionally, the insulation plate 28), but allows for a degree (e.g., 2-3 mm) of longitudinal translation of the PSU 24 and heat spreader plate 30 with respect to the PCB 22 (and, optionally, the insulation plate 28). Thus, the PSU 24 and associated heat spreader plate 30 is biased away from the PCB 22 (and, optionally, the insulation plate 28), and towards and into the lid 14 of the enclosure 10, providing a thermal pressure contact between the heat spreader plate 30 and the lid 14 of the enclosure 10. With a spring mechanism 26 disposed at each corner of the PSU 24, this thermal pressure contact is consistent across the lateral and transverse expanses of the heat spreader plate 30.

Figure 5:
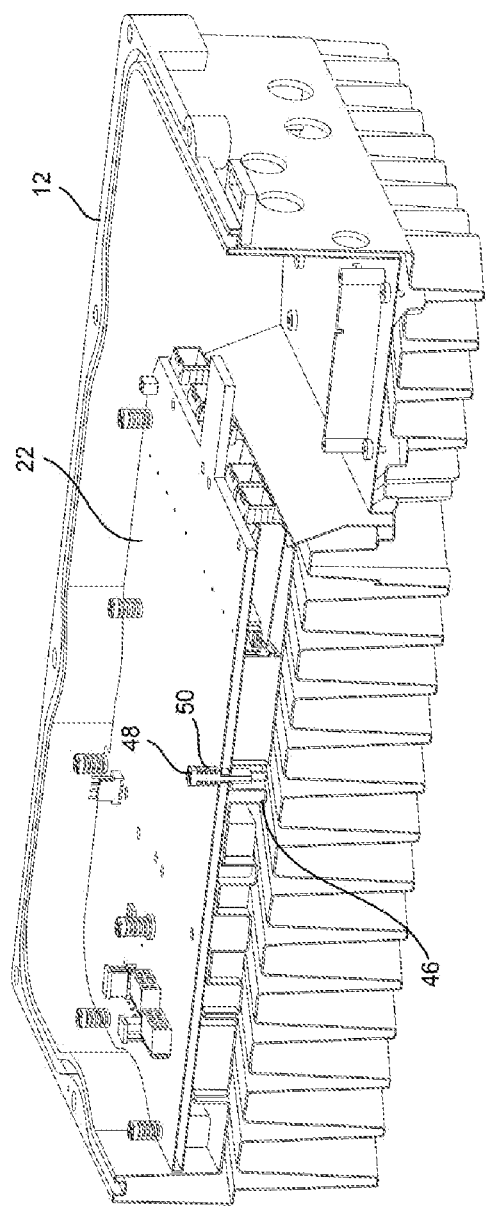
FIG. 5 is a cut-away perspective view of the PCB and spring mechanisms of the enclosure of FIG. 1.

FIG. 5 is a cut-away perspective view of the PCB 22 and spring mechanisms 46 of the enclosure 10 of FIG. 1. In addition to the above arrangement, the PCB 22 may be secured to the base chassis 12 by a plurality of spring mechanisms 46 each including a screw 48 having a head portion, a body portion, and a tip portion. The tip portion of the screw 48 is secured to the base chassis 12, with the body portion of the screw 48 being disposed through the PCB 22 and the head portion of the screw 48 retaining a resilient member or spring 50 (e.g., a coil spring, a resilient collar, or a spring tab) that is disposed concentrically about the body portion of the screw 48 between the PCB 22 and the head portion of the screw 48. This arrangement laterally restrains the PCB 22, but allows for a degree of longitudinal translation of the PCB 22 with respect to the base chassis. Thus, the PCB 22 is biased towards the base chassis 12, providing a degree of vibration resistance to the PCB 22 (and the coupled PSU(s) 24). With a spring mechanism 46 disposed at various points about the PCB 22, this degree of vibration resistance is consistent across the lateral and transverse expanses of the PCB 22.

Figure 6:
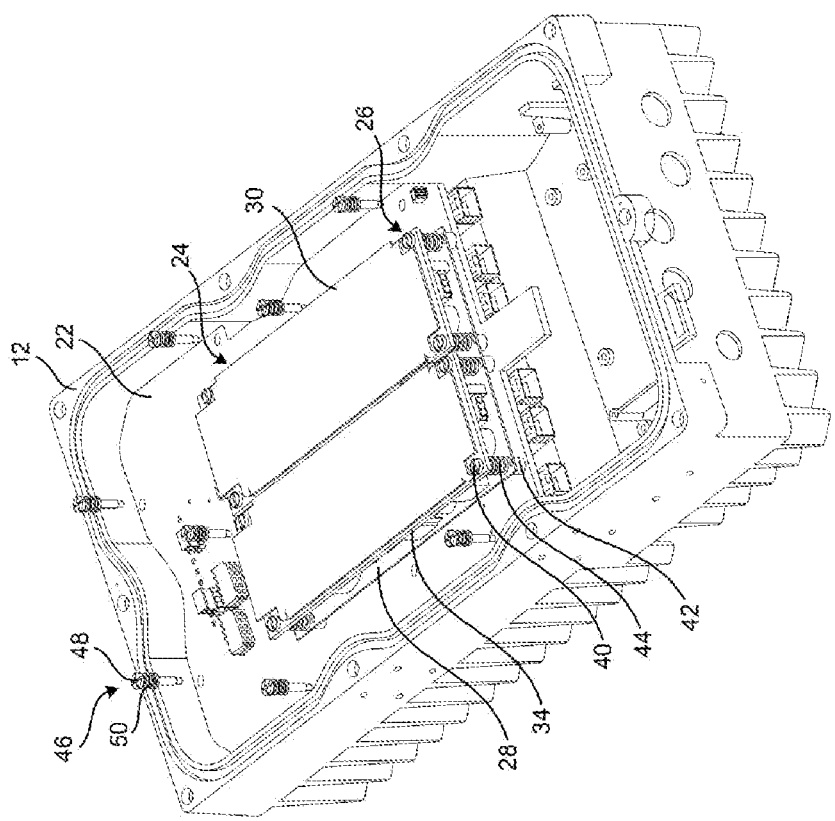
FIG. 6 is a perspective view of the PCB, insulation plate, PSUs, and spring mechanisms of the enclosure of FIG. 1.

FIG. 6 is a perspective view of the PCB 22, insulation plate 28, PSUs 24, and spring mechanisms 26 and 46 of the enclosure of FIG. 1. It should again be noted that the enclosure 10 may include a single PSU 24 and heat spreader plate 30 disposed adjacent to (e.g., above) the PCB 22 within the base chassis 12, or multiple PSUs 24 and heat spreader plates 30 disposed adjacent to (e.g., above) the PCB 22 in a side-by-side configuration (as illustrated) within the base chassis 12. The components of the PSU(s) 24 are isolated from the components disposed on the PCB 22 via the one or more insulation plates 28, providing thermal isolation between the components of the PSU(s) 24 and the components disposed on the PCB 22. Each PSU 24 and associated heat spreader plate 30 is biased away from the PCB 22, and towards and into the lid 14 of the enclosure 10 by the spring mechanisms 26 disposed in each corner of the PSU PCB 34 in the embodiment illustrated. Each spring mechanism 26 includes a screw 40 having a head portion, a body portion, a shoulder, and a tip portion. The tip portion of the screw 40 is secured into a solder nut 42 coupled to the PCB 22, with the body portion of the screw 40 being disposed through the PSU PCB 34 and the head portion of the screw 40 retaining the PSU PCB 34. The shoulder of the screw 40 may be used to secure the associated portion of the insulation plate 28 adjacent to (e.g., above) the PCB 22. A resilient member or spring 44 (e.g., a coil spring, a resilient collar, or a spring tab) is disposed concentrically about the body portion of the screw 40 between the PCB 22 and/or insulation plate 28 and the PSU PSB 34. This arrangement laterally restrains the PSU 24 and heat spreader plate 30 with respect to the PCB 22 (and, optionally, the insulation plate 28), but allows for a degree (e.g., 2-3 mm) of longitudinal translation of the PSU 24 and heat spreader plate 30 with respect to the PCB 22 (and, optionally, the insulation plate 28). Thus, the PSU 24 and associated heat spreader plate 30 is biased away from the PCB 22 (and, optionally, the insulation plate 28), and towards and into the lid 14 of the enclosure 10, providing a thermal pressure contact between the heat spreader plate 30 and the lid 14 of the enclosure 10. With a spring mechanism 26 disposed at each corner of the PSU 24, this thermal pressure contact is consistent across the lateral and transverse expanses of the heat spreader plate 30.

In addition to the above arrangement, the PCB 22 may be secured to the base chassis 12 by the plurality of spring mechanisms 46 each including a screw 48 having a head portion, a body portion, and a tip portion. The tip portion of the screw 48 is secured to the base chassis 12, with the body portion of the screw 48 being disposed through the PCB 22 and the head portion of the screw 48 retaining a resilient member or spring 50 (e.g., a coil spring, a resilient collar, or a spring tab) that is disposed concentrically about the body portion of the screw 48 between the PCB 22 and the head portion of the screw 48. This arrangement laterally restrains the PCB 22, but allows for a degree of longitudinal translation of the PCB 22 with respect to the base chassis. Thus, the PCB 22 is biased towards the base chassis 12, providing a degree of vibration resistance to the PCB 22 (and the coupled PSU(s) 24). With a spring mechanism 46 disposed at various points about the PCB 22, this degree of vibration resistance is consistent across the lateral and transverse expanses of the PCB 22.

Figure 7:
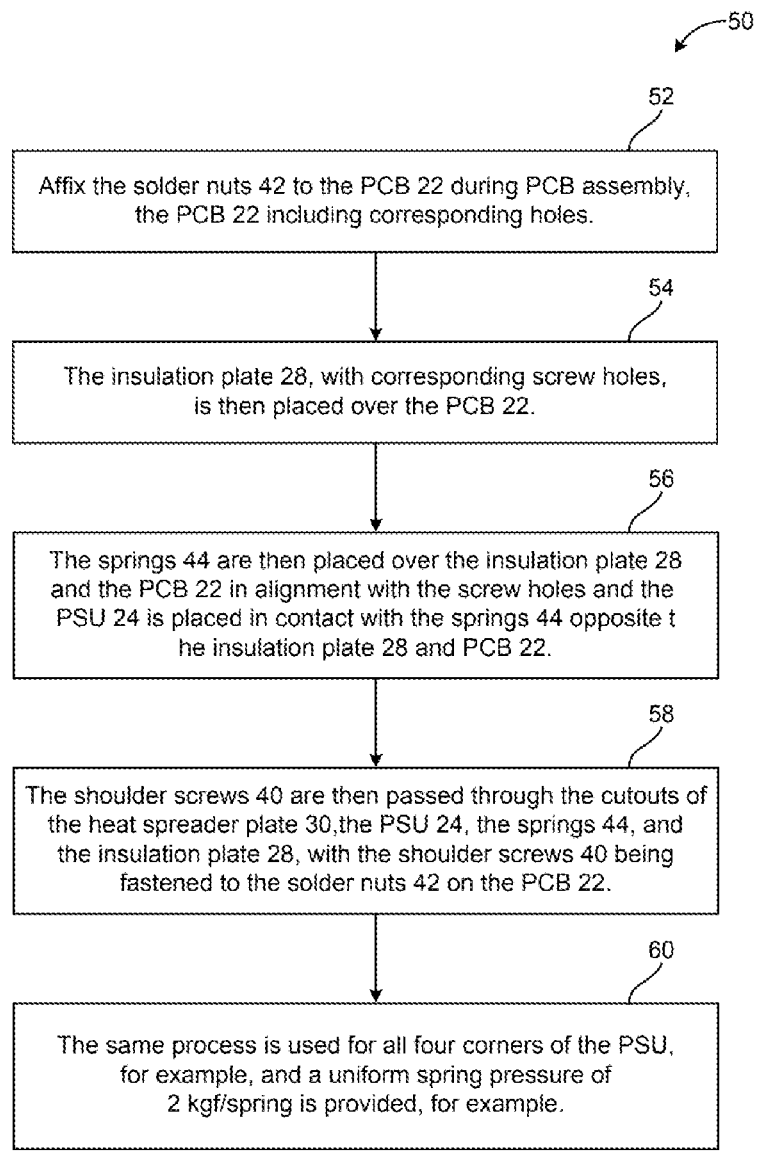
FIG. 7 is a flowchart of one embodiment of the networking equipment enclosure assembly method of the present disclosure.

FIG. 7 is a flowchart of one embodiment of the networking equipment enclosure assembly method 50 of the present disclosure. Given the PCB 22, solder nuts 42, insulation plate 28, shoulder screws 40, resilient members or springs 44 and PSU 24, with the PCB 22 optionally affixed in the base chassis 12 as provided above and the heat spreader plate 30 including cutouts for the placement of the shoulder screws 40, the method 50 first includes affixing the solder nuts 42 to the PCB 22 (optionally to a bottom side thereof) during PCB assembly, the PCB 22 including corresponding holes. (Step 52). This provides a unitary PCB component. The insulation plate 28, with corresponding screw holes, is then placed over the PCB 22. (Step 54). The resilient members or springs 44 are then placed over the insulation plate 28 and the PCB 22 in alignment with the screw holes and the PSU 24 is placed in contact with the resilient members or springs 44 opposite the insulation plate 28 and PCB 22. (Step 56). The shoulder screws 40 are then passed through the cutouts of the heat spreader plate 30, the PSU 24, the resilient members or springs 44, and the insulation plate 28, with the shoulder screws 40 being fastened to the solder nuts 42 on the PCB 22. (Step 58). The same process is used for all four corners of the PSU, for example, and a uniform spring pressure of 2 kgf/spring is provided, for example. (Step 60).

Figure 8:
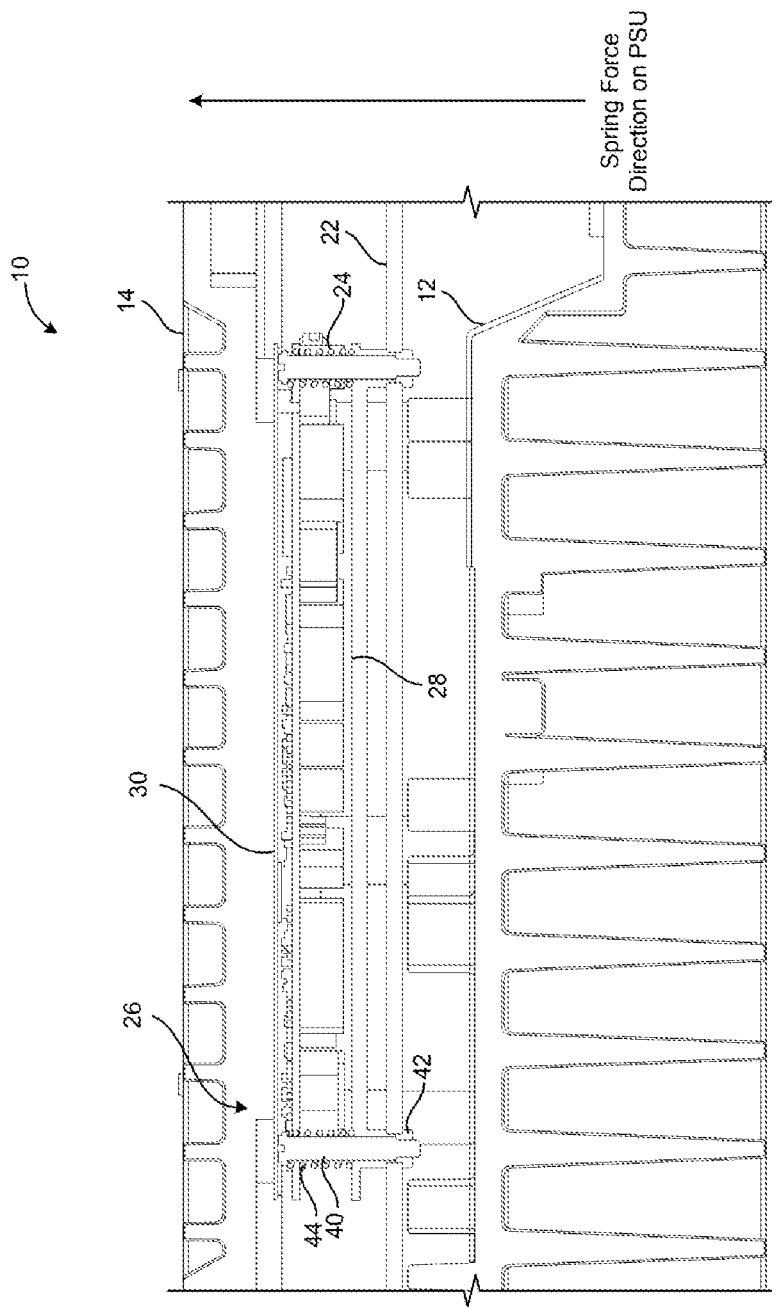
FIG. 8 is a cross-sectional view of the base chassis, lid, PCB, PSU, heat spreader plate, and spring mechanisms of the enclosure of FIG. 1.

FIG. 8 is a cross-sectional view of the base chassis 12, lid 14, PCB 22, PSU 24, heat spreader plate 30, and spring mechanisms 26 of the enclosure 10 of FIG. 1. It should again be noted that the enclosure 10 may include a single PSU 24 and heat spreader plate 30 disposed adjacent to (e.g., above) the PCB 22, or multiple PSUs 24 and heat spreader plates 30 disposed adjacent to (e.g., above) the PCB 22 in a side-by-side configuration. The components of the PSU(s) 24 are isolated from the components disposed on the PCB 22 via the one or more insulation plates 28, providing thermal isolation between the components of the PSU(s) 24 and the components disposed on the PCB 22. Each PSU 24 and associated heat spreader plate 30 is biased away from the PCB 22, and towards and into the lid 14 of the enclosure 10 by the spring mechanisms 26 disposed in each corner of the PSU PCB 34 in the embodiment illustrated. Each spring mechanism 26 includes a screw 40 having a head portion, a body portion, a shoulder, and a tip portion. The tip portion of the screw 40 is secured into a solder nut 42 coupled to the PCB 22, with the body portion of the screw 40 being disposed through the PSU PCB 34 and the head portion of the screw 40 retaining the PSU PCB 34. The shoulder of the screw 40 may be used to secure the associated portion of the insulation plate 28 adjacent to (e.g., above) the PCB 22. A resilient member or spring 44 (e.g., a coil spring, a resilient collar, or a spring tab) is disposed concentrically about the body portion of the screw 40 between the PCB 22 and/or insulation plate 28 and the PSU PSB 34. This arrangement laterally restrains the PSU 24 and heat spreader plate 30 with respect to the PCB 22 (and, optionally, the insulation plate 28), but allows for a degree (e.g., 2-3 mm) of longitudinal translation of the PSU 24 and heat spreader plate 30 with respect to the PCB 22 (and, optionally, the insulation plate 28). Thus, the PSU 24 and associated heat spreader plate 30 is biased away from the PCB 22 (and, optionally, the insulation plate 28), and towards and into the lid 14 of the enclosure 10, providing a thermal pressure contact between the heat spreader plate 30 and the lid 14 of the enclosure 10. With a spring mechanism 26 disposed at each corner of the PSU 24, this thermal pressure contact is consistent across the lateral and transverse expanses of the heat spreader plate 30. The internal surface of the lid 14 may include one or more recesses for accommodating the head portion of each screw 40, such that the heat spreader plate 30 is biased into the internal surface of the lid 14 without obstruction.

In general, the spring-loaded PSU of the present disclosure creates a uniform, pressurized dry contact with the lid when it is closed. This significantly improves the thermal heat transfer path from the PSU heat generating components to ambient through the lid and base chassis. The PSU floats over the PCB with restrained horizontal motion and a degree of free vertical motion.

All heat dissipating components are mounted on one side of the PSU PCB and heat spreader plate that covers it. A gap pad disposed between the heat spreader plate and the components bridges the gap and enhances thermal performance.

The dry micro-TIM coating on the heat spreader plate is equivalent to other thermal interface materials between the two surfaces in contact. The micro-TIM coating is equivalent to thermal grease, but allows opening the lid frequently without damaging the thermal interface modality, requiring its repeated replacement. The lid does not pose any resistance while it is opened and closed, unlike thermal grease, for example.

The input and output cables do not move when the lid is opened and are tied only to the base chassis. This improves reliability in the field, as well as during transportation, as there are no moving parts.

The length of the input and output power cables is reduced, which helps significantly reduce damage and EMI risks and cost.

This enables the entire assembly to be incorporated into a base unit, which otherwise would be required to be split into top and bottom chassis pieces. This helps reduce cost and simplifies assembly/testing during production.

Figure 9:
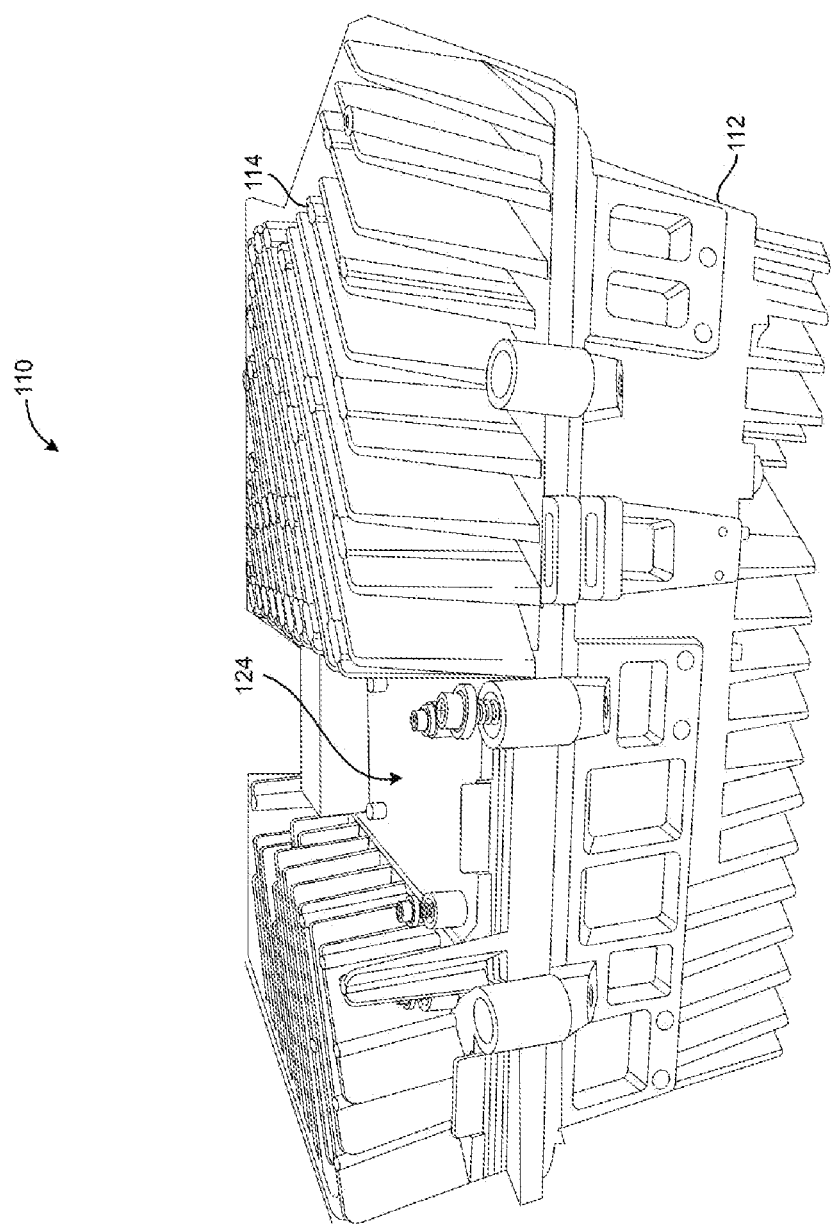
FIG. 9 is a perspective view of an open frame PSU conventionally mounted as a FRU outside the base chassis and lid (specifically outside the lid) of a networking equipment enclosure.
Figure 10:
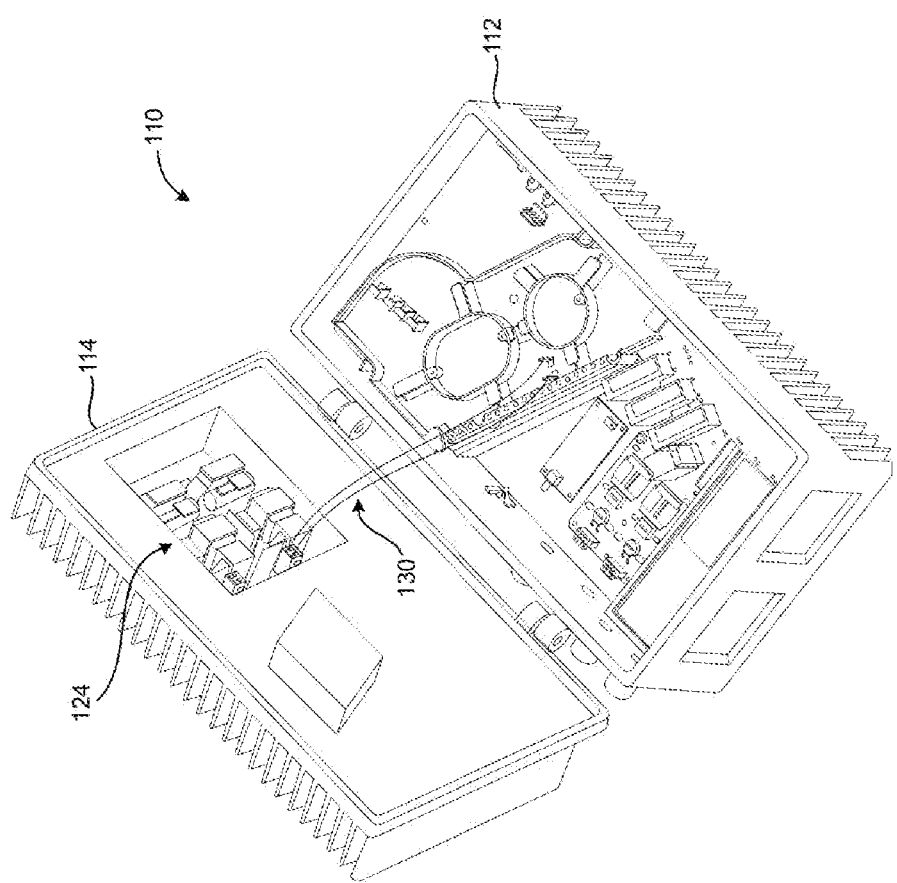
FIG. 10 is a perspective view of an open frame PSU mounted inside and coupled to the lid of a networking equipment enclosure, highlighting the cables spanning the moveable components.

FIG. 9 is a perspective view of an open frame PSU 124 mounted as a FRU outside the base chassis 112 and lid 114 (specifically outside the lid 114) of a networking equipment enclosure 110, while FIG. 10 is a perspective view of an open frame PSU 124 mounted inside and coupled to the lid 114 of a networking equipment enclosure 110, highlighting the cables 130 spanning the moveable components. External mounting brings ingress protection design into consideration, as enclosure openings are required for cables and/or the like that must be sealed with gaskets and/or the like. Both external and internal (i.e., lid) mounting bring cable length and routing into consideration, as longer cables are prone to physical damage (e.g., via cable pinching), especially when they span moveable and/or separable components (i.e., the base chassis and the lid, as the cables shown do), are likely to experience voltage drop and cause/receive greater electromagnetic interference (EMI) with/from other electronic components, and must be routed with various cable management systems, taking up valuable space when small form factor is desirable. As a result, design, production, and servicing are all more complicated. Both external and internal (i.e., lid) mounting also require the use of a thermal interface material, such as a gap pad or thermal paste, to couple the PSU to the lid and/or base chassis that needs to be replaced or reapplied every time a PSU is removed and replaced.

Again, the present disclosure provides a hardened outdoor (or indoor) networking equipment enclosure in which the PSU is mounted inside the base chassis and lid of the enclosure over a PCB including the various electronic components of the product. A spring mechanism is used to bias the PSU against the closed lid of the enclosure and a heat spreader plate is disposed between the PSU and the lid to enhance the thermal interface between the PSU and the lid, which is a pressure/contact interface. An insulation plate is disposed between the PCB and the PSU to minimize heat transfer between the PSU and the PCB and thermally isolate the PSU. Heat transfer from the lid to the base chassis and the surrounding environment is unaffected.

This internal arrangement eliminates or minimizes enclosure openings that are required for cables and/or the like that must be sealed with gaskets and/or the like. This internal arrangement also eliminates longer cables that are prone to physical damage (e.g., via cable pinching), are likely to experience voltage drop and cause/receive greater EMI with/from other electronic components, and must be routed with various cable management systems, taking up valuable space when small form factor is desirable. No cables span moveable and/or separable components (i.e., the base chassis and the lid). No thermal interface material, such as a gap pad or thermal paste, needs to be replaced or reapplied every time the PSU is removed and replaced to couple the PSU to the lid, as a dry thermal pressure/contact interface is provided to dissipate PSU heat to ambient. The stacked PCB/PSU arrangement utilized itself promotes a small form factor as compared to a side-by-side arrangement.

Although the present disclosure is illustrated and described with reference to embodiments and specific examples thereof, it will be readily apparent that other embodiments and examples may perform similar functions and/or achieve like results. All such equivalent embodiments and examples are within the spirit and scope of the present disclosure, are contemplated thereby, and are intended to be covered by the following non-limiting claims in all environmental contexts and for all purposes.

What is claimed is:

1. A networking equipment enclosure assembly, comprising:
   a base chassis;
   a lid coupled to the base chassis;
   a printed circuit board disposed within the base chassis; and
   a power supply unit disposed between the printed circuit board and the lid, wherein the power supply unit is spaced apart from and biased away from the printed circuit board and the base chassis and towards the lid via a spring mechanism coupled between the printed circuit board and the power supply unit.

2. The networking equipment enclosure assembly of claim 1, further comprising a heat spreader plate disposed between the power supply unit and the lid and coupled to the power supply unit.

3. The networking equipment enclosure assembly of claim 2, wherein the power supply unit is biased towards the lid via the spring mechanism coupled between the printed circuit board and the power supply unit such that the heat spreader plate is pressed into thermal contact with the lid.

4. The networking equipment enclosure assembly of claim 2, further comprising one or more thermally conductive gap pads disposed between the power supply unit and the heat spreader plate.

5. The networking equipment enclosure assembly of claim 1, further comprising an insulation plate disposed between the printed circuit board and the power supply unit.

6. The networking equipment enclosure assembly of claim 1, wherein the spring mechanism comprises one or more resilient members or springs disposed between the printed circuit board and the power supply unit.

7. The networking equipment enclosure assembly of claim 6, wherein each of the one or more resilient members or springs is disposed about a screw coupled to the printed circuit board through the power supply unit.

8. The networking equipment enclosure assembly of claim 7, wherein the screw constrains lateral and traverse translation of the power supply unit with respect to the printed circuit board, but allows a degree of longitudinal motion of the power supply unit with respect to the printed circuit board between the printed circuit board and the lid.

9. A networking equipment assembly, comprising:
   a base chassis;
   a printed circuit board disposed within the base chassis; and
   a power supply unit spaced apart from and biased away from the printed circuit board and the base chassis via a spring mechanism coupled between the printed circuit board and the power supply unit.

10. The networking equipment assembly of claim 9, further comprising:

a lid coupled to the base chassis, wherein the power supply unit is biased towards the lid via the spring mechanism.

11. The networking equipment assembly of claim 10, further comprising a heat spreader plate disposed between the power supply unit and the lid and coupled to the power supply unit.

12. The networking equipment assembly of claim 11, wherein the power supply unit is biased towards the lid via the spring mechanism coupled between the printed circuit board and the power supply unit such that the heat spreader plate is pressed into thermal contact with the lid.

13. The networking equipment assembly of claim 11, further comprising one or more thermally conductive gap pads disposed between the power supply unit and the heat spreader plate.

14. The networking equipment assembly of claim 9, further comprising an insulation plate disposed between the printed circuit board and the power supply unit.

15. The networking equipment assembly of claim 9, wherein the spring mechanism comprises one or more resilient members or springs disposed between the printed circuit board and the power supply unit.

16. The networking equipment assembly of claim 15, wherein each of the one or more resilient members or springs is disposed about a screw coupled to the printed circuit board through the power supply unit.

17. The networking equipment assembly of claim 16, wherein the screw constrains lateral and traverse translation of the power supply unit with respect to the printed circuit board, but allows a degree of longitudinal motion of the power supply unit with respect to the printed circuit board between the printed circuit board and the lid.

18. A networking equipment thermal management method, comprising:

given a base chassis and a lid coupled to the base chassis, providing a printed circuit board within the base chassis;

providing a power supply unit between the printed circuit board and the lid, wherein the power supply unit is spaced apart from the printed circuit board; and biasing the power supply unit away from the printed circuit board and the base chassis and towards the lid via a spring mechanism coupled between the printed circuit board and the power supply unit.

19. The networking equipment thermal management method of claim 18, further comprising:

providing a heat spreader plate between the power supply unit and the lid and coupled to the power supply unit; and biasing the power supply unit towards the lid via the spring mechanism coupled between the printed circuit board and the power supply unit such that the heat spreader plate is pressed into thermal contact with the lid.

20. The networking equipment thermal management method of claim 19, further comprising one or more of:

providing one or more thermally conductive gap pads between the power supply unit and the heat spreader plate; and providing an insulation plate adjacent to the printed circuit board between the printed circuit board and the power supply unit.

* * * * *